United States Patent
Groeninger

(10) Patent No.: US 7,768,284 B2
(45) Date of Patent: Aug. 3, 2010

(54) TEST APPARATUS FOR TESTING A SEMICONDUCTOR DEVICE, AND METHOD FOR TESTING THE SEMICONDUCTOR DEVICE

(75) Inventor: Horst Groeninger, Maxhuette-Haidhof (DE)

(73) Assignee: Infineon Technologies AG, Neubiberg (DE)

( * ) Notice: Subject to any disclaimer, the term of this patent is extended or adjusted under 35 U.S.C. 154(b) by 205 days.

(21) Appl. No.: 10/598,052

(22) PCT Filed: Feb. 9, 2005

(86) PCT No.: PCT/DE2005/000216

§ 371 (c)(1),
(2), (4) Date: Sep. 10, 2008

(87) PCT Pub. No.: WO2005/078460

PCT Pub. Date: Aug. 25, 2005

(65) Prior Publication Data

US 2008/0315899 A1   Dec. 25, 2008

(30) Foreign Application Priority Data

Feb. 16, 2004   (DE) ................. 10 2004 007 696

(51) Int. Cl.
*G01R 31/02* (2006.01)
*G01R 31/26* (2006.01)
(52) U.S. Cl. .............. 324/755; 324/765; 324/754
(58) Field of Classification Search .......... None
See application file for complete search history.

(56) References Cited

U.S. PATENT DOCUMENTS

| | | | | |
|---|---|---|---|---|
| 3,354,394 A | * | 11/1967 | James | 324/765 |
| 5,049,813 A | * | 9/1991 | Van Loan et al. | 324/754 |
| 5,157,325 A | * | 10/1992 | Murphy | 324/761 |
| 5,330,919 A | * | 7/1994 | Westbrook et al. | 438/15 |
| 5,453,701 A | * | 9/1995 | Jensen et al. | 324/755 |
| 5,500,606 A | | 3/1996 | Holmes | |
| 5,523,586 A | * | 6/1996 | Sakurai | 257/48 |
| 5,701,085 A | * | 12/1997 | Malladi et al. | 324/754 |
| 6,034,426 A | * | 3/2000 | Patel et al. | 257/698 |
| 6,188,230 B1 | * | 2/2001 | Birk | 324/754 |
| 6,297,654 B1 | | 10/2001 | Barabi | |
| 6,559,665 B1 | | 5/2003 | Barabi | |
| 7,262,615 B2 | * | 8/2007 | Cheng et al. | 324/755 |

FOREIGN PATENT DOCUMENTS

| | | |
|---|---|---|
| DE | 10229541 A1 | 1/2004 |
| EP | 0196149 A1 | 1/1986 |
| EP | 0196249 B1 | 1/1990 |
| JP | 2002343522 A2 | 11/2002 |
| WO | WO00/17662 | 3/2000 |

* cited by examiner

*Primary Examiner*—Paresh Patel
(74) *Attorney, Agent, or Firm*—Dicke, Billig & Czaja, PLLC

(57) ABSTRACT

A test apparatus for testing a semiconductor device having contact pads on its top and its back, and to a method for testing the semiconductor device is disclosed. In one embodiment, the test apparatus has a test socket which is mounted on a test printed circuit board. Internal through-contact elements of the test socket can be used to test contact pads on the top of the semiconductor device. The contact pads on the back of the semiconductor device can be connected for the purpose of testing the semiconductor device using external through-contact elements which are arranged outside of the locating seat.

22 Claims, 1 Drawing Sheet

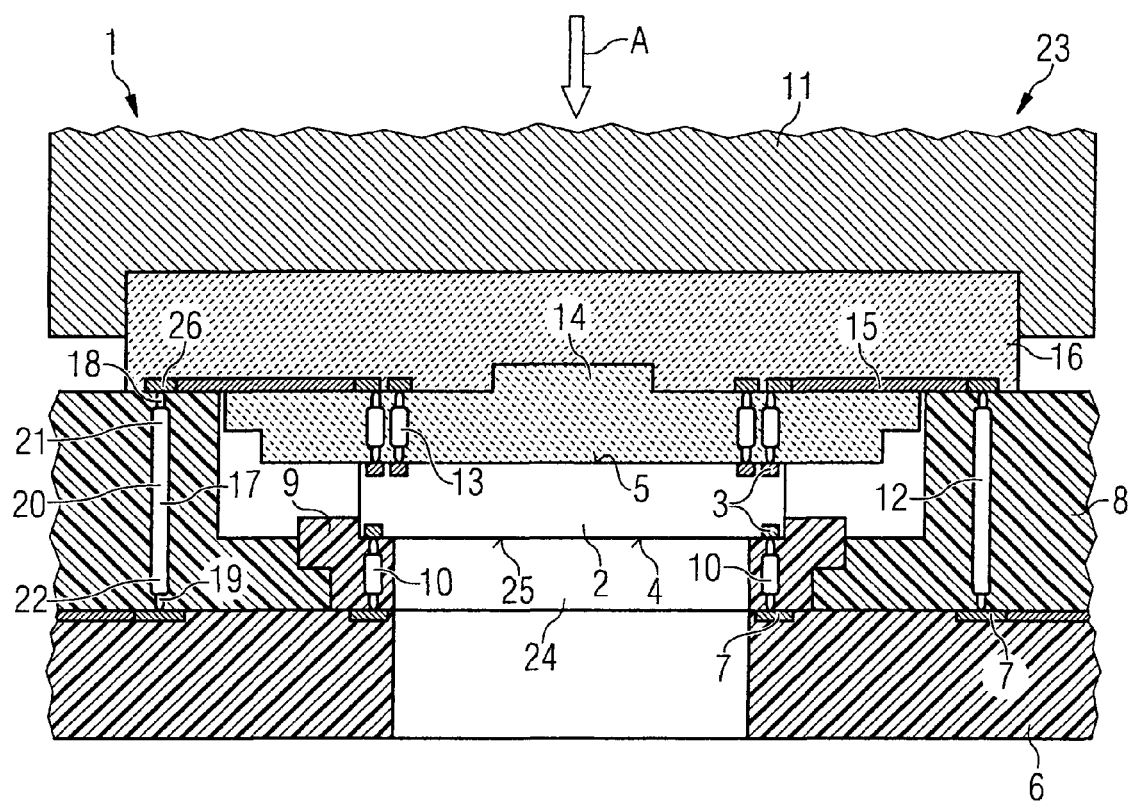

TEST APPARATUS FOR TESTING A SEMICONDUCTOR DEVICE, AND METHOD FOR TESTING THE SEMICONDUCTOR DEVICE

CROSS REFERENCE TO RELATED APPLICATION

This Utility Patent Application claims the benefit of the filing date of German Application No. DE 10 2004 007 696.0, filed Feb. 16, 2004, and International Application No. PCT/DE2005/000216, filed Feb. 9, 2005, both of which are herein incorporated by reference.

BACKGROUND

One embodiment of the invention relates to a test apparatus for testing a semiconductor device having contact pads on its top and its bottom. The invention also relates to a method for testing the semiconductor device. In one embodiment, the test apparatus has a test printed circuit board having contact pads and with a test socket mounted on it. The test socket has a locating seat for locating the top of the semiconductor device. Within the region of the locating seat, the test socket contains internal through-contact elements to the test printed circuit board. These internal through-contact elements electrically connect the contact pads of the top of the semiconductor device to the contact pads of the test printed circuit board. In addition, the test apparatus has a stamp for pressing the semiconductor device onto the internal through-contact elements of the test socket.

A test apparatus of this kind for semiconductor devices with integrated circuits is known from the document DE 102 29 541 A1. The known test apparatus has a test socket from which contact elements project which are fitted with spring contacts which can have electrical contact made with them by external contacts of an integrated circuit. The known test apparatus has the drawback that the semiconductor devices to be tested can be tested using integrated circuits only if the semiconductor device's contacts with which contact is to be made are arranged on one side on a bottom of the semiconductor device. The known test apparatus cannot be used to make contact with contact pads on both sides of the semiconductor device, namely on its top and its back. Another drawback of the known test apparatus is its complex design. The complex design simultaneously has a long associated conversion time, which hinders rapid conversion of the test apparatus for different semiconductor devices. In addition, the contact elements with spring contacts are of complex design for this known test apparatus and their manufacture is accordingly costly.

SUMMARY

The present invention provides a test apparatus for testing a semiconductor device having contact pads on its top and its back, the test apparatus being able to be converted for different semiconductor devices to be tested within short conversion times, and having resilient contact-connection elements which are cheap to manufacture and can be quickly interchanged if required.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 1 illustrates a schematic cross section through a test apparatus 1 in an embodiment of the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the FIGURE(S) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

The invention provides a test apparatus for testing a semiconductor device having contact pads on its top and contact pads on its back. The test apparatus has a test printed circuit board having contact pads. This test printed circuit board has a test socket mounted on it. The test socket has a locating seat for locating the top of the semiconductor device to be tested. For testing, the region of the locating seat contains internal through-contact elements through the test socket to the test printed circuit board. These through-contact elements are used for electrically connecting the contact pads of the top of the semiconductor device to the contact pads of the test printed circuit board. In addition, the test apparatus has a stamp for pressing the semiconductor device onto the internal through-contact elements of the test socket. Besides the internal through-contact elements, the test socket has external through-contact elements which are arranged outside of the locating seat for the semiconductor device. These external contact-connection elements are used for electrically connecting the contact pads on the test printed circuit board to contact pads on the back of the semiconductor device to be tested when the stamp is pressed on.

This test apparatus has the advantage that when the stamp is pressed on both the contact pads on the top of the semiconductor device and the contact pads on the bottom of the semiconductor device are connected to appropriate contact pads on the test printed circuit board via the external and internal through-contact elements of the test socket. Another advantage of this test apparatus can be seen in the through-contact elements themselves, which have a tubular central piece which has test tips at its ends. These test tips project from the relevant tops and bottoms of the device components, such as the test socket, of the test apparatus. In addition, these test tips are cushioned by spring elements within the tubular central piece of the through-contact elements such that it is possible to achieve reliable contact-connection between contact pads and contact pads when the stamp of the test apparatus presses on.

In one embodiment of the invention, the through-contact elements used are what are known as "pogo pins". The dimensions of such "pogo pins" match the size of the contact pads and contact pads with which contact is to be made. The length of the respective central piece of the through-contact elements matches the respective thickness of the corresponding device component, such as the test socket or the locating seat. The internal through-contact elements are therefore shorter than the external through-contact elements in the test socket, because the external through-contact elements need to span a greater thickness of the test socket region.

In one embodiment of the invention, a holding part is arranged between the stamp of the test apparatus and the back of the semiconductor device to be tested. This holding part is likewise equipped with through-contact elements and interacts with a wiring part which is arranged between the stamp and the holding part. The wiring part has rewiring lines in the direction of the holding part. These rewiring lines extend from positions of through-contact elements of the holding part to positions of the external through-contact elements of the test socket. When the stamp is pressed on, the through-contact elements of the holding part are electrically connected to the contact pads on the back of the semiconductor device.

This results in a wiring path for testing the back contacts of the semiconductor device, via the through-contact elements of the holding part to the rewiring lines of the wiring part and from these rewiring lines of the holding part via the external through-contact elements of the test socket to the contact pads of the test printed circuit board. This design allows reliable contact to be made with the contact pads of the back of the semiconductor device, especially since firstly the holding part with its through-contact elements fits exactly into the wiring part with its rewiring lines, and the wiring part itself fits exactly into the stamp. Appropriately shaped cutouts in the test socket allow the holding part with its through-contact elements to be placed with an exact fit onto the back of the semiconductor device.

The stamp is designed such that it is suitable for simultaneously pressing on a plurality of different through-contact elements. The stamp simultaneously allows the through-contact elements to be placed onto the contact pads of the back of the semiconductor device and of the external contact-connection elements of the test socket onto the test printed circuit board and also of the internal through-contact elements of the test socket onto the test printed circuit board and onto contact pads of the top of the semiconductor device. To this end, the stamp may be fitted on a pivot arm. This pivot arm pivots the stamp into a test position in which the stamp can execute a test programm by simultaneously pressing the through-contact elements onto the intended contact-connection points of the test apparatus and of the semiconductor device.

In another embodiment of the invention, the wiring part on the stamp is fitted interchangeably. This has the advantage that when the test apparatus is converted for different semiconductor devices an appropriate wiring part with appropriately matched rewiring lines on the stamp can be interchanged without any great time involvement. The holding part on the wiring part is also fitted interchangeably. This has the advantage that different holding parts for different backs of semiconductor devices can be interchanged with one and the same wiring part if this wiring part has different rewiring line patterns, in order to locate and connect holding parts at different positions of the through-contact elements.

The locating seat which locates the active top of a semiconductor device can have a central opening which corresponds to an optical sensor region of the semiconductor device and which is accessible from outside of the test apparatus. An opening of this kind in the locating seat therefore allows the sensor region of the semiconductor device to be irradiated by an irradiation source outside of the test apparatus, for example. To this end, the test printed circuit board has an accordingly matching opening in order to allow the irradiation to pass to an optical sensor region of the semiconductor device.

A method for testing a semiconductor device having contact pads on its top and its back has the following method. A test apparatus as described above is provided. This test apparatus is then equipped with a test socket which has a locating seat matching the semiconductor device to be tested. In addition, the stamp of the test apparatus is equipped with a holding part and a wiring part which match the semiconductor device to be tested, particularly its back. When the test apparatus has been equipped in this way, the test socket of the test apparatus is fitted with the semiconductor device to be tested by placing the top of the semiconductor device onto the locating seat of the test socket. To carry out test methods, the stamp with the matching wiring part and holding part is then pressed onto the back of the semiconductor device, to make contact with the contact pads provided for a test on the top and the back of the semiconductor device, using the through-contact elements of the test apparatus and the making of electrical connections to the test printed circuit board.

This method has the advantage that few actions are required to test the widest variety of semiconductor devices having contact pads or external contacts on their top and their back. To this end, just three components of the test apparatus are interchanged to match a respective semiconductor device, namely the locating seat of the test socket, the wiring part and the holding part of the stamp. The design of these device components of the test apparatus is inexpensive on account of the through-contact elements used, and the time involvement for conversion is likewise reduced over conventional test apparatuses. This test apparatus can therefore be used to test semiconductor devices cheaply.

In summary, it can be stated that the inventive test apparatus allows simple contact to be made with contact pads on both sides of a semiconductor device using "pogo pins", which are integrated firstly in the test socket and secondly in a holding part, also called a contact nest. To this end, the test socket can be screwed onto an underlying test printed circuit board which is used to execute the test programmes for the respective semiconductor device. For a test, the semiconductor device can be guided in the locating seat of the test socket, or to be held by an appropriate cutout in the holding part of the stamp. In addition, the test printed circuit board may also be of multilayer design in order to allow a large number of contact pads for connecting a correspondingly large number of contact pads of a semiconductor device.

In FIG. 1, the test apparatus includes two units, firstly a test printed circuit board 6 on which a test socket 8 is arranged, and a stamp 11 bearing a wiring part 16 and a holding part 14. The two parts of the test apparatus 1 can be separated conversely to the arrow direction A, and then open up the path for fitting the test socket 8 with a semiconductor device 2 which is to be tested.

To locate the semiconductor device 2, the test socket 8 has a locating seat 9. This locating seat 9 is in a form such that the semiconductor device 2 can fit exactly into the locating seat 9. The region of the locating seat 9 contains internal through-contact elements 10 which make a connection between contact pads 7 of the test printed circuit board 6 and contact pads 3 on the active top 4 of a semiconductor device 2. In the example illustrated in FIG. 1, a sensor device on the test apparatus 1 is tested. To this end, the test apparatus 1 has an opening 24 both in the test printed circuit board 6 and in the locating seat 9, said opening corresponding in size to a sensor region 25 of the sensor device.

Besides the internal through-contact elements 10 in the region of the locating seat 9, the test socket 8 has external through-contact elements 12 outside of the region of the locating seat 9. The through-contact elements 10 and 12 comprise a tubular central piece 20 having the ends 21 and 22. The tubular central piece 20 contains a spring element which cushions test tips 18 and 19 at the ends 21 and 22 of a through-contact pin 17 of this kind resiliently such that contact can be made between contact pads of the test printed circuit board 6 and corresponding contact pads 26 of the wiring part 16.

However, the contact is not made until the stamp 11 with the wiring part 16 is pressed in direction A onto the back 5 of the semiconductor device 2. This pressure involves through-contact elements 13 in the holding part 14 of the stamp 11 being simultaneously connected to contact pads 3 on the back 5 of the semiconductor device 2. In order to connect these through-contact elements 13 of the holding part 14 to the external through-contact elements 12 of the test socket 8, the wiring part 16 has rewiring lines 15 which extend from the positions of the through-contact elements 13 of the holding part 14 to the positions of the external through-contact elements 12 of the test socket 8.

When the stamp 11 is pressed on in direction A, the stamp 11 adopts a test position 23, as illustrated in FIG. 1, and ensures that both the top 4 and the back 5 have their contact pads 3 of the semiconductor device 2 connected to the contact pads 7 of the test printed circuit board 6. To this end, the wiring part 16 fits into the stamp 11, and the holding part 14 fits into the wiring part 16. Secondly, the test socket 8 is fixed on the test printed circuit board 6, and the locating seat 9 fits into the test socket 8 and has an attachment into which the semiconductor device 2 for its part can be fitted such that reliable contact can be made with the internal through-contact elements 10 in the region of the locating seat 9.

What is claimed is:

1. A test apparatus for testing a semiconductor device having contact pads on its top and contact pads on its back, where the test apparatus comprising:
    a test printed circuit board having contact pads;
    a test socket mounted on the test printed circuit board, where the test socket has a locating seat for locating the top of the semiconductor device, and where the region of the locating seat contains internal through-contact elements through the test socket to the test printed circuit board in order to make an electrical connection between the contact pads of the top of the semiconductor device and the contact pads of the test printed circuit board;
    a stamp for pressing the semiconductor device onto the internal through-contact elements of the test socket; and
    where the test socket has external through-contact elements which are arranged outside of the locating seat and which make an electrical connection between contact pads on the test printed circuit board and contact pads on the back of the semiconductor device to be tested when the stamp is pressed on.

2. The test apparatus as claimed in claim 1, comprising when the stamp is pressed on, the contact pads of the back of the semiconductor device are electrically connected to contact pads on the test printed circuit board via through-contact elements of a holding part and via rewiring lines of a wiring part, and also via the external through-contact elements in the test socket.

3. The test apparatus as claimed in claim 2, comprising where the stamp has, in a direction of the back of the semiconductor device to be tested, the wiring part and the holding part with through-contact elements for making contact with the contact pads on the back of the semiconductor device.

4. The test apparatus as claimed in claim 2, comprising where the wiring part of the stamp has rewiring lines from the positions of the through-contact elements of the holding part to positions of the external through-contact elements in the test socket.

5. The test apparatus as claimed in claim 2, comprising where the wiring part on the stamp is fitted interchangeably.

6. The test apparatus as claimed in claim 2, comprising where the holding part on the wiring part is fitted interchangeably.

7. The test apparatus as claimed in claim 1, comprising the through-contact elements having through-contact pins that have spring-guided test tips that project from a top and a bottom, opposite the top, of the respective device component of the test apparatus.

8. The test apparatus as claimed in claim 1, comprising the through-contact elements having a tubular central piece which has test tips at its ends, with a spring element arranged in the central piece elastically cushioning the test tips.

9. The test apparatus as claimed in claim 1, comprising the stamp is configured for simultaneously pressing the through-contact elements onto the contact pads of the back of the semiconductor device, the external through-contact elements of the test socket onto the test printed circuit board, and the internal through-contact elements of the test socket onto the test printed circuit board and onto the contact pads of the top of the semiconductor device.

10. The test apparatus as claimed in claim 1, comprising where the stamp is fitted on a pivot arm that pivots the stamp into a test position in which the pivot arm having the stamp is oriented such that the through-contact elements are simultaneously pressed against the provided contact points of the test apparatus and of the semiconductor device.

11. The test apparatus as claimed in claim 1, comprising where the locating seat has a central opening which corresponds to an optical sensor region of the semiconductor device and which is accessible from outside of the test apparatus.

12. The test apparatus as claimed in claim 1, comprising where the opening is an irradiation opening which allows the semiconductor device to be irradiated.

13. A method for testing a semiconductor device having contact pads on its top and its back, the method comprising:
    providing a test apparatus as claimed in claim 1;
    equipping the test apparatus with a test socket which has a locating seat matching the semiconductor device to be tested and with a stamp which has a holding part and a wiring part which match the semiconductor device to be tested;
    fitting the test socket of the test apparatus with the semiconductor device to be tested by putting the top of the semiconductor device onto the locating seat of the test socket; and
    pressing the stamp with the wiring part and the holding part onto the back of the semiconductor device to make contact with the contact pads, provided for a test, on the top and the back of the semiconductor device using the through-contact elements of the test apparatus to make electrical connections to the test printed circuit board.

14. A test apparatus for testing a semiconductor device having contact pads on its top and contact pads on its back, where the test apparatus comprising:

a test socket mounted on a test printed circuit board, where the test socket has a locating seat for locating the top of the semiconductor device, and where the region of the locating seat contains internal through-contact elements through the test socket to the test printed circuit board in order to make an electrical connection between the contact pads of the top of the semiconductor device and the contact pads of the test printed circuit board:

a stamp; and where the test socket has external through-contact elements which are arranged outside of the locating seat and which make an electrical connection between contact pads on the test printed circuit board and contact pads on the back of the semiconductor device, and when the stamp is pressed on, the contact pads of the back of the semiconductor device are electrically connected to contact pads on the test printed circuit board via through-contact elements of a holding part and via rewiring lines of a wiring part, and also via the external through-contact elements in the test socket.

15. The test apparatus as claimed in claim 14, comprising where the stamp has, in a direction of the back of the semiconductor device to be tested, the wiring part and the holding part with through-contact elements for making contact with the contact pads on the back of the semiconductor device.

16. The test apparatus as claimed in claim 14, comprising where the wiring part of the stamp has rewiring lines from the positions of the through-contact elements of the holding part to positions of the external through-contact elements in the test socket.

17. The test apparatus as claimed in claim 14, comprising the through-contact elements having through-contact pins that have spring-guided test tips that project from a top and a bottom, opposite the top, of the respective device component of the test apparatus.

18. The test apparatus as claimed in claim 17, comprising the through-contact elements having a tubular central piece which has test tips at its ends, with a spring element arranged in the central piece elastically cushioning the test tips.

19. The test apparatus as claimed in claim 18, comprising the stamp is configured for simultaneously pressing the through-contact elements onto the contact pads of the back of the semiconductor device, the external through-contact elements of the test socket onto the test printed circuit board, and the internal through-contact elements of the test socket onto the test printed circuit board and onto the contact pads of the top of the semiconductor device.

20. The test apparatus as claimed in claim 19, comprising where the stamp is fitted on a pivot arm that pivots the stamp into a test position in which the pivot arm having the stamp is oriented such that the through-contact elements are simultaneously pressed against the provided contact points of the test apparatus and of the semiconductor device.

21. The test apparatus as claimed in claim 20, comprising where the locating seat has a central opening which corresponds to an optical sensor region of the semiconductor device and which is accessible from outside of the test apparatus.

22. The test apparatus as claimed in claim 21, comprising where the opening is an irradiation opening which allows the semiconductor device to be irradiated.

\* \* \* \* \*